(12) United States Patent
Hu et al.

(10) Patent No.: US 11,774,241 B2
(45) Date of Patent: *Oct. 3, 2023

(54) LINE EDGE ROUGHNESS ANALYSIS USING ATOMIC FORCE MICROSCOPY

(71) Applicant: Taiwan Semiconductor Manufacturing Co., Ltd., Hsinchu (TW)

(72) Inventors: Wei-Shan Hu, Hsinchu (TW); Dong Gui, Hsinchu (TW); Jang Jung Lee, Hsinchu (TW); Che-Liang Li, Hsinchu (TW); Duen-Huei Hou, Hsinchu (TW); Wen-Chung Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/552,301

(22) Filed: Dec. 15, 2021

(65) Prior Publication Data

US 2022/0107179 A1  Apr. 7, 2022

Related U.S. Application Data

(63) Continuation of application No. 16/927,906, filed on Jul. 13, 2020, now Pat. No. 11,236,996, which is a
(Continued)

(51) Int. Cl.
*G01B 21/30* (2006.01)
*G01Q 60/24* (2010.01)

(52) U.S. Cl.
CPC ............. *G01B 21/30* (2013.01); *G01Q 60/24* (2013.01)

(58) Field of Classification Search
CPC ................................ G01B 21/30; G01Q 60/24
See application file for complete search history.

(56) References Cited

U.S. PATENT DOCUMENTS

| 9,557,347 B2 | 1/2017 | Humphris |
| 10,746,542 B2 * | 8/2020 | Hu ..................... H01L 29/7854 |

(Continued)

FOREIGN PATENT DOCUMENTS

| CN | 103429526 A | 12/2013 |
| CN | 103292747 B | 3/2016 |

(Continued)

OTHER PUBLICATIONS

Li et al., "Amplitude and Spatial Frequency Characterization of Line Edge Roughness Using AFM," *Nanotechnology and Precision Engineering* 6(5): 367-371, Sep. 2008.

(Continued)

*Primary Examiner* — Nicole M Ippolito
*Assistant Examiner* — Hanway Chang
(74) *Attorney, Agent, or Firm* — Seed IP Law Group LLP

(57) ABSTRACT

Embodiments disclosed herein relate generally to methods for measuring a characteristic of a substrate. In an embodiment, the method includes scanning over the substrate with a scanning probe microscope, the substrate having fins thereon, the scanning obtaining images showing respective fin top regions of the fins, the scanning probe microscope interacting with respective portions of sidewalls of the fins by a scanning probe oscillated during the scanning, selecting images obtained at a predetermined depth below the fin top regions to obtain a line edge profile of the fins, by a processor-based system, analyzing the line edge profile of the fins using power spectral density (PSD) method to obtain spatial frequency data of the line edge profile of the fins, and
(Continued)

by the processor-based system, calculating line edge roughness of the fins based on the spatial frequency data.

20 Claims, 12 Drawing Sheets

Related U.S. Application Data continuation of application No. 16/362,283, filed on Mar. 22, 2019, now Pat. No. 10,746,542.

(60) Provisional application No. 62/736,196, filed on Sep. 25, 2018.

(56) References Cited

U.S. PATENT DOCUMENTS

| | | | | |
|---|---|---|---|---|
| 11,236,996 | B2 * | 2/2022 | Hu | ................. H01L 29/7854 |
| 2009/0263024 | A1 | 10/2009 | Yamaguchi et al. | |

FOREIGN PATENT DOCUMENTS

| | | | |
|---|---|---|---|
| CN | 105572044 | A | 5/2016 |
| CN | 105092324 | B | 3/2018 |
| TW | 201242022 | A | 10/2012 |
| TW | 201600828 | A | 1/2016 |
| TW | 201723427 | A | 7/2017 |
| TW | 201809676 | A | 3/2018 |
| TW | 201828382 | A | 8/2018 |

OTHER PUBLICATIONS

Zhao et al., "Analysis Method for Nanometer-Scale Line edge Roughness Based on Stationary Wavelet Transform," *Nanotechnology and Precision Engineering* 7(2): 147-154, Mar. 2009.

Li, Ning (2010). *Research on Measurement and Characterization Method of Edge Roughness of Nano-scale Semiconductor Scribe* (doi:10.7666/d.D269290) [Ph.D. Thesis from Harbin Institute of Technology] URL: https://www.wanfangdata.com.cn/.

* cited by examiner

LINE EDGE ROUGHNESS ANALYSIS USING ATOMIC FORCE MICROSCOPY

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices.

The line edge roughness of the fin structure can affect the performance of the transistors. To ensure the line edge roughness is maintained within a range desired for downstream processing, a surface measurement technique can be performed to obtain roughness information of the fin structure. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
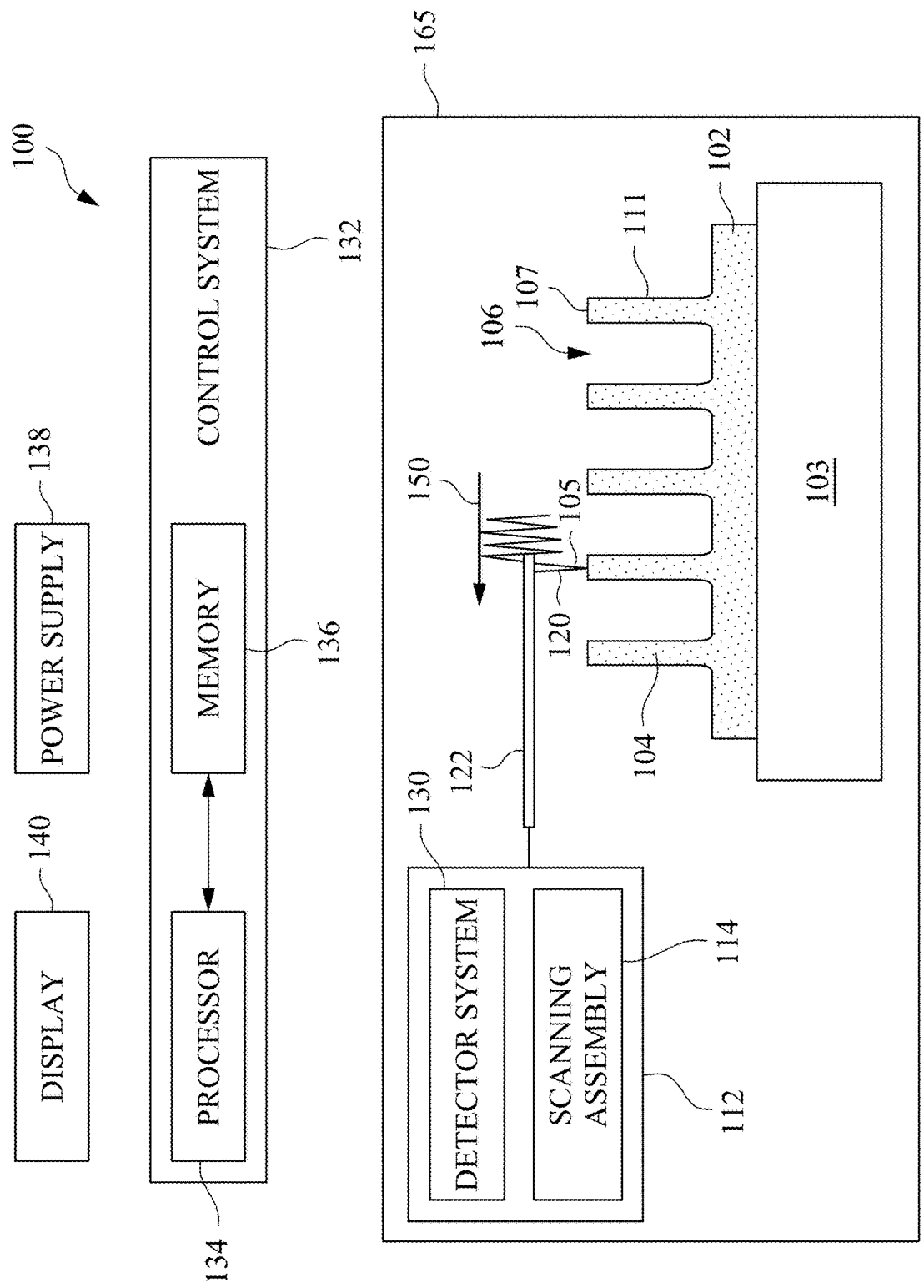
FIG. 1 illustrates a system for measurement and analysis of surface characteristics of a substrate according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of this disclosure relate generally to a system and method to determine topographical feature characteristics (e.g., fin line edge roughness) of a semiconductor device, such as a FinFET device. A probe tip oscillating in vertical movement (Z direction) is employed to scan across the three-dimensional structure (e.g., fins, gates, or metal lines, etc.) of the semiconductor device in an X and/or Y direction to obtain feature characteristics (e.g., line edge profile) of the fins at the target regions of the substrate. The line edge profile is then analyzed using a power spectral density (PSD) method to extract line edge roughness (LER) of the fins at a spatial frequency domain of interest. The vertical oscillation allows the probe tip to reach different depths from the fin top and be in close proximity to the bottom between the adjacent fins. Therefore, sub-nanometer resolution images of the fin top and region near the fin top can be obtained. The information of the extracted line edge roughness of the fins can be used to refine or correct fin fabrication process so as to form fins with reduced LER.

FIG. 1 illustrates a system 100 for measurement and analysis of surface characteristics of a substrate 102 according to some embodiments of the present disclosure. The substrate 102 as shown may be a portion of an intermediate structure of a semiconductor device, such as a FinFET device. The substrate which may be a bulk semiconductor substrate, a semiconductor-on-insulator (SOI) substrate, or the like, which may be doped (e.g., with a p-type or an n-type dopant) or undoped. The substrate 102 may include an elemental semiconductor including silicon (Si) or germanium (Ge); a compound semiconductor; an alloy semiconductor; or a combination thereof. The substrate 102 has a plurality of fins 104. Each fin 104 can provide an active area where one or more integrated devices are formed or to be formed. The fins 104 may be fabricated using suitable processes performed on the substrate 102, including masking, photolithography, and/or etch processes, to form trenches 106 into the substrate 102, thereby forming the fins 104 extended upwardly from the substrate 102. The trenches 106 may have an aspect ratio of about 3:1 to about 30:1, for example about 5:1 to about 20:1. The term "aspect ratio" in this disclosure refers to the ratio of the height dimension to the width dimension of a particular feature, for example, trench height/trench width. The trench height substantially equals to the height of the fins 104 protruding above the substrate 102 while the trench width substantially equals to the width or distance of the region between two neighboring fins 104.

The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 104 and form the trenches 106.

The system 100 generally includes a scanning probe microscope (SPM) 112 having a scanning assembly 114. The SPM 112 may be an atomic force microscope (AFM) or a scanning tunneling microscopy (STM). The SPM 112 is used to measure surface properties of the substrate 102 disposed on a stage 103. The scanning assembly 114 includes, or is operatively connected to, a scanning probe 120, for measuring the surface topography of the fins 104. While one scanning probe 120 is shown, in some embodiments, the scanning assembly 114 may include two or more scanning probes operating simultaneously to increase scanning throughput.

The scanning probe 120 may be made from a metal, carbon nanotube or semiconductor material, such as silicon. The scanning probe 120 can be placed on or brought immediately adjacent to the top surface 107 of the fins 104. While the scanning probe 120 is illustrated as having a substantially conical probe tip 105, other shapes of probe tips may be utilized. Example shape of the probe tips are further discussed below with respect to FIGS. 2A to 2C. The scanning probe 120 is coupled to an oscillating actuator (not shown) through a cantilever 122, which may also be made from a semiconductor material such as silicon. The actuator may move the scanning probe 120 in any direction with respect to the substrate 102 being analyzed. Additionally or alternatively, the substrate 102 may move in any direction relative to the scanning probe 120. In either case, an image of the substrate 102 is acquired by scanning the scanning probe 120 over the fins 104 at target regions of the substrate 102. The relative movement between the scanning probe 120 and the substrate 102 will be discussed in more detail below in FIGS. 3A to 3D and 4A to 4C.

The SPM 112 also includes a detector system 130 for detecting movement of the scanning probe 120 relative to the substrate 102, which movement corresponds to surface characteristics of the substrate 102. The surface characteristics may include line edge roughness (LER) of the fins 104, fin sidewall profile, and/or fin sidewall roughness. The scanning probe 120 is controlled to move the probe tip 105 up and down commensurate with the surface characteristics of the fins 104 while scanning in the X and/or Y direction. The scanning probe 120 may operate in a contact mode, in which the probe tip 105 is in contact with the surface of the fins 104, or a non-contact mode, in which the probe tip 105 is maintained at a spacing above the surface of the fins 104. The cantilever 122 deflects in response to electrostatic, magnetic, van der Waals or other forces between the probe tip 105 and the surface of the fins 104. In these cases, the deflection of the cantilever 122 from which the probe tip 105 projects is measured. In some embodiments, the scanning probe 120 may operate in a tapping mode where the scanning probe 120 is oscillated vertically at or near a resonant frequency of the cantilever 122 in the vicinity of the surface of the fins 104 so that the probe tip 105 makes intermittent contacts (tapping) with the surface once in every oscillation period. In some embodiments, the cantilever 122 may be moved at scanning frequencies in a range of about 2 Hz to about 20 Hz, for example about 5 Hz to about 10 Hz. The substrate 102 may be transferred to an environmentally controlled chamber 165 where the scanning operations are performed. In one embodiment, the chamber 165 is maintained at a dry condition in which the moisture is under 0.5 ppm and oxygen is under 1 ppm. The dry condition can help prevent moisture from building up on the surface of the substrate 102, which would otherwise degrade the image resolution and lifetime of the probe tip 105. In some embodiments, the scanning operations may be performed under vacuum or atmospheric condition.

The detector system 130 can detect the movement of the scanning probe 120 to provide measurement data that is passed to a control system 132. The detector system 130 may employ any suitable sensing mechanism to detect movement of the scanning probe 120. For example, an optical detection scheme may be used, in which a beam of light (e.g., a laser beam) is reflected or diffracted by the probe tip 105 or the cantilever 122 an amount proportional to the movement of the scanning probe 120. The beam may be detected at a photodetector that provides an output signal indicative of the detected movement of the scanning probe 120. The output signal therefore reflects the topography of the surface of the fins 104. The output signals are then provided to the control system 132. The control system 132 may include a processor 134, which may be programmed to control operation of the various components within the system 100 in order to perform various functions described in this disclosure. While one processor 134 is shown, it is contemplated that a plurality of processors and/or processing systems may be included as part of and/or external to the system 132 for performing signal analysis.

Figure 5:
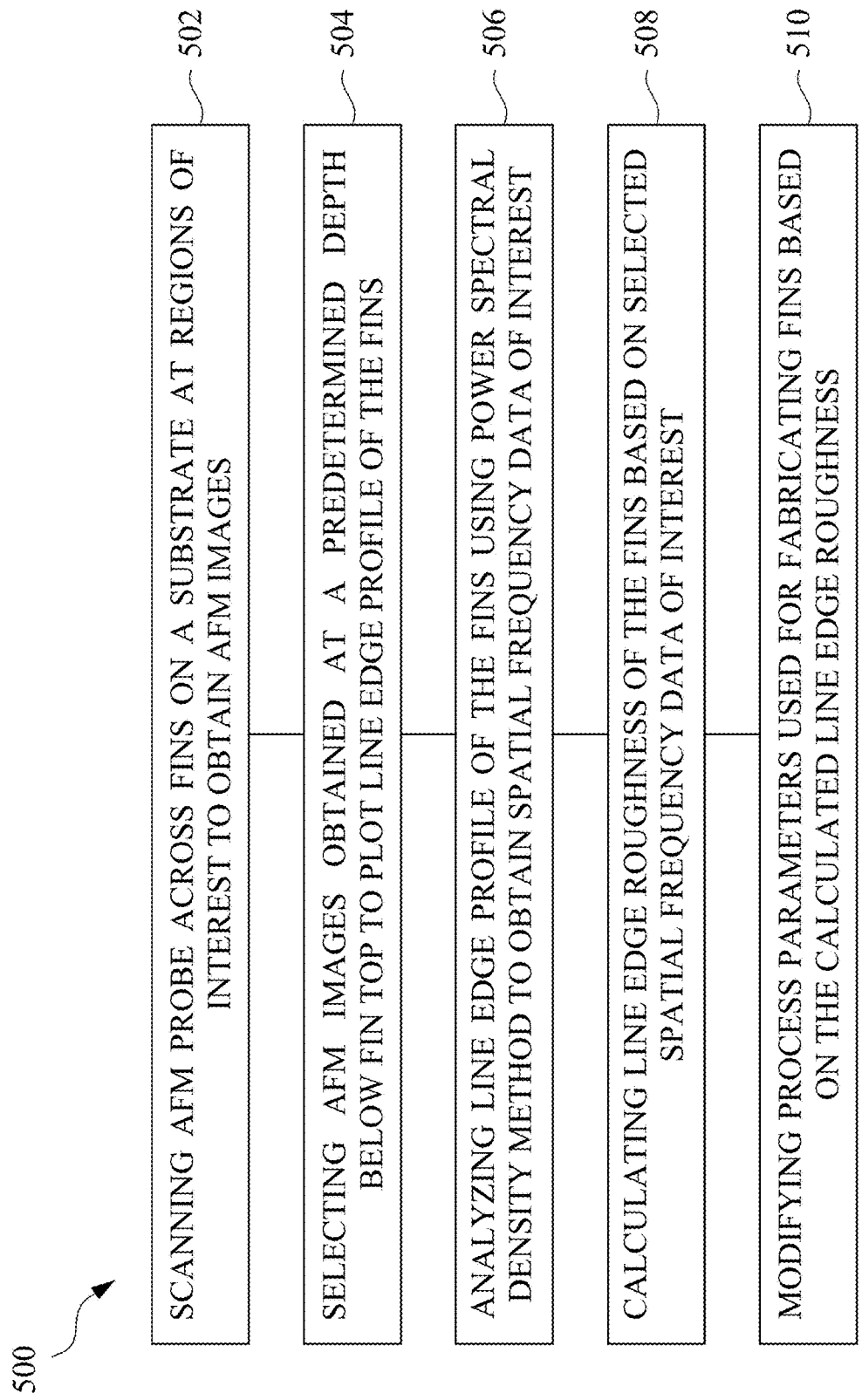
FIG. 5 is a flowchart illustrating a method of LER analysis for a semiconductor substrate according to some embodiments of the present disclosure.

The system 100 also includes a memory 136 operatively connected to the processor 134 for storing computer-executable instructions, which may be executed by the processor 134 to perform operations and/or signal analysis discussed in this disclosure, such as the method to be discussed below with respect to FIG. 5. The memory 136 may be a non-transitory computer readable medium including, for example, read only memory (ROM) or random access memory (RAM). The RAM can be the main memory where the operating system and application programs are located. The memory 136 may also serve as a storage medium for temporarily storing information such as the measurement date (e.g., amplitude, probe tip position relative to the substrate surface, etc.), substrate position, line edge profile, statistical data, programs for determining surface characteristics of the substrate from measurement data, and/or other data which may be employed to perform embodiments of the present disclosure. If needed, the memory 136 may also include a hard drive or other suitable nonvolatile storage medium.

A power supply 138 is coupled to the system 100 to provide power to the system 100. The system 100 may include a display 140 for displaying an image constructed based on the measurement data. The control system 132 may include any other components for communicating, e.g., measurement data to other systems via a network, for inputting and/or outputting data such as via a keyboard, mouse, printer, etc., or for any other functionality of a computing system.

The control system 132, for example, the processor 134, is operable to control the scanning of the scanning probe 120 over the surface of the fins 104. The scanning probe 120 may scan across the substrate 102 in any direction or desired pattern. For example, the scanning probe 120 may move in a direction 150 perpendicular to the longitudinal direction of the fins 104. Alternatively, the scanning probe 120 may move in a direction 150 along the longitudinal direction of the fins 104. The processor 134 may further control scanning intervals of the scanning probe 120 by adjusting the position of the probe tip 105 in any direction between each scanning interval. For example, a position device (not shown) may be used to provide relative movement between the scanning probe 120 and the substrate 102 for selectively scanning target regions of the substrate 102.

The processor 134 can be programmed to analyze the measurement data obtained from the detector system 130 according to various embodiments of the present disclosure. The scanning probe 120 moves across the surface of the substrate 102 and produces measurement data that is generated by the detector system 130 and from which the processor 134 may determine selected surface characteristics of the fins 104 and/or construct a topographic image (e.g., a line edge profile, a graphical outline, etc.) of the fins 104 with resolution according to the dimension of the probe tip 105. A topographic image may be directed to the display 140 by the control system 132.

Figure 2C:
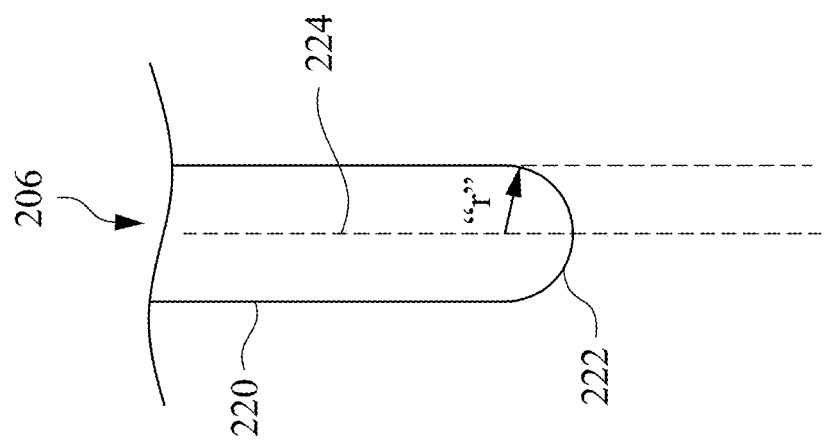
FIGS. 2A to 2C illustrate fragmentary cross-sectional views of different scanning probes according to some embodiments of the present disclosure.
Figure 2B:
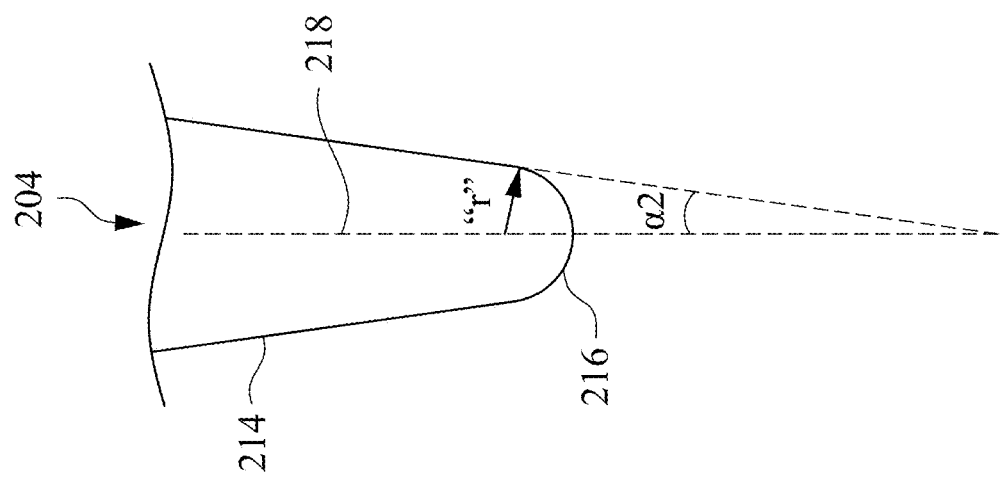
Figure 2A:
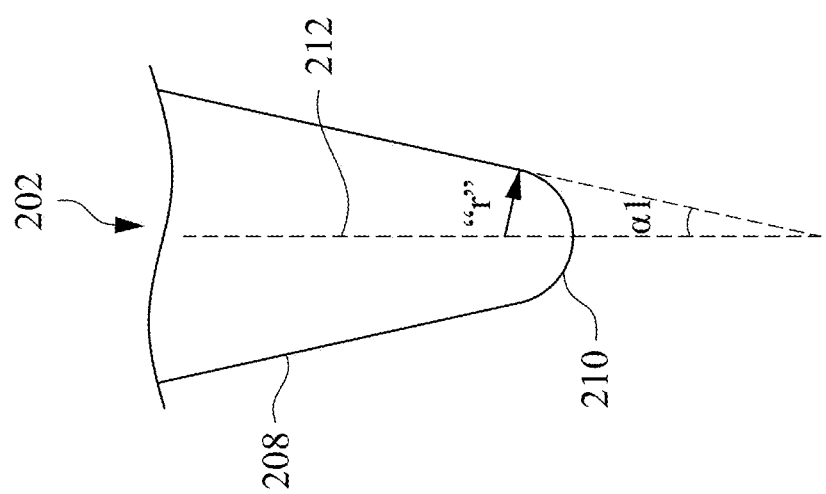

FIGS. 2A to 2C illustrate a fragmentary cross-sectional view of three different scanning probes 202, 204, 206 that according to some embodiments of the present disclosure. The scanning probes 202, 204, 206 may be and/or replace the scanning probe 120 of FIG. 1. The scanning probes 202, 204, 206 are sized to allow their probe tips to penetrate into the narrow space between dense fins 104. The scanning probes 202, 204, 206 use spherical-shaped probe tips and vary in cross-sectional profiles to provide different measurement depth below the fin top, as will be discussed in more detail below in FIGS. 3A to 3D and 4A to 4C. The scanning probe 202 shown in FIG. 2A has a conical sidewall 208 and a probe tip 210. The conical sidewall 208 has a profile that expands away from the probe tip 210. The conical sidewall 208 extends in a direction that is at an angle "α1" with respect to the longitudinal axis 212 of the scanning probe 202. In an embodiment, the angle "α1" is in a range from about 1° to about 25°, such as about 8° to about 20°, for example about 10° to about 16°, for example about 13°. The scanning probe 204 shown in FIG. 2B is similar to the scanning probe 202 shown in FIG. 2A except that a less-inclined sidewall probe is adapted. The scanning probe 204 also has a conical sidewall 214 and a probe tip 216. The conical sidewall 214 extends in a direction that is at an angle "α2" with respect to the longitudinal axis 218 of the scanning probe 204. In an embodiment, the angle "α2" is in a range from about 1° to about 25°, such as about 2° to about 10°, for example about 2° to about 4°. The scanning probe 206 shown in FIG. 2C is a cylindrical probe having straight parallel sidewall 220 and a probe tip 222. The scanning probe 206 exhibits a cross sectional profile that is relatively constant along at least a portion of its length. Therefore, the sidewall 220 is parallel to the longitudinal axis 224 of the scanning probe 206.

Each of the probe tips 210, 216, 222 of the scanning probes 202, 204, 206 has a spherical-shaped probe tip. A spherical-shaped probe tip has a consistent tip radius that can ensure consistent image quality of atomic force microscopy. This is because the scanning resolution provided by the spherical-shaped probe tip is generally constant regardless of which point of the probe tip contacts the surface of the substrate. The diameter of the scanning probes 202, 204, 206 is chosen to be smaller than fin-to-fin spacing between neighboring pairs of the fins so that the scanning probes, at least the probe tips 210, 216, 222, can penetrate the narrow space between dense fins. The fin-to-fin spacing may be in a range from about 10 to about 30 nm. In an embodiment, the probe tips 210, 216, 222 may have a probe tip radius "r" in a range from about 1 nm to about 15 nm, for example about 2 nm to about 5 nm. The consistent tip radius of less than 10 nm can provide good resolution and reproducibility. It is contemplated that the fin-to-fin spacing and/or the probe tip radius may vary depending on the application.

FIGS. 3A to 3D illustrate example scanning movement between the scanning probe 206 of FIG. 2C and the fins during a series of interaction periods in accordance with some embodiments of the present disclosure. A piezoelectric tube (not shown) may move the scanning probe 206 in a direction along an X-axis to scan across a surface of a fin, such as the fins 104 of the substrate 102 shown in FIG. 1. In an embodiment shown in FIGS. 3A to 3D, the scanning probe 206 may incrementally move along the X-axis at a predetermined travel distance of about 0.05 nm to about 5 nm, for example about 0.5 nm to about 1 nm. The travel distance in this disclosure refers to a distance between two tip-sample contacts during the scanning, which may vary depending upon the application and/or the pitch distance between two immediately adjacent fins.

Figure 3A:
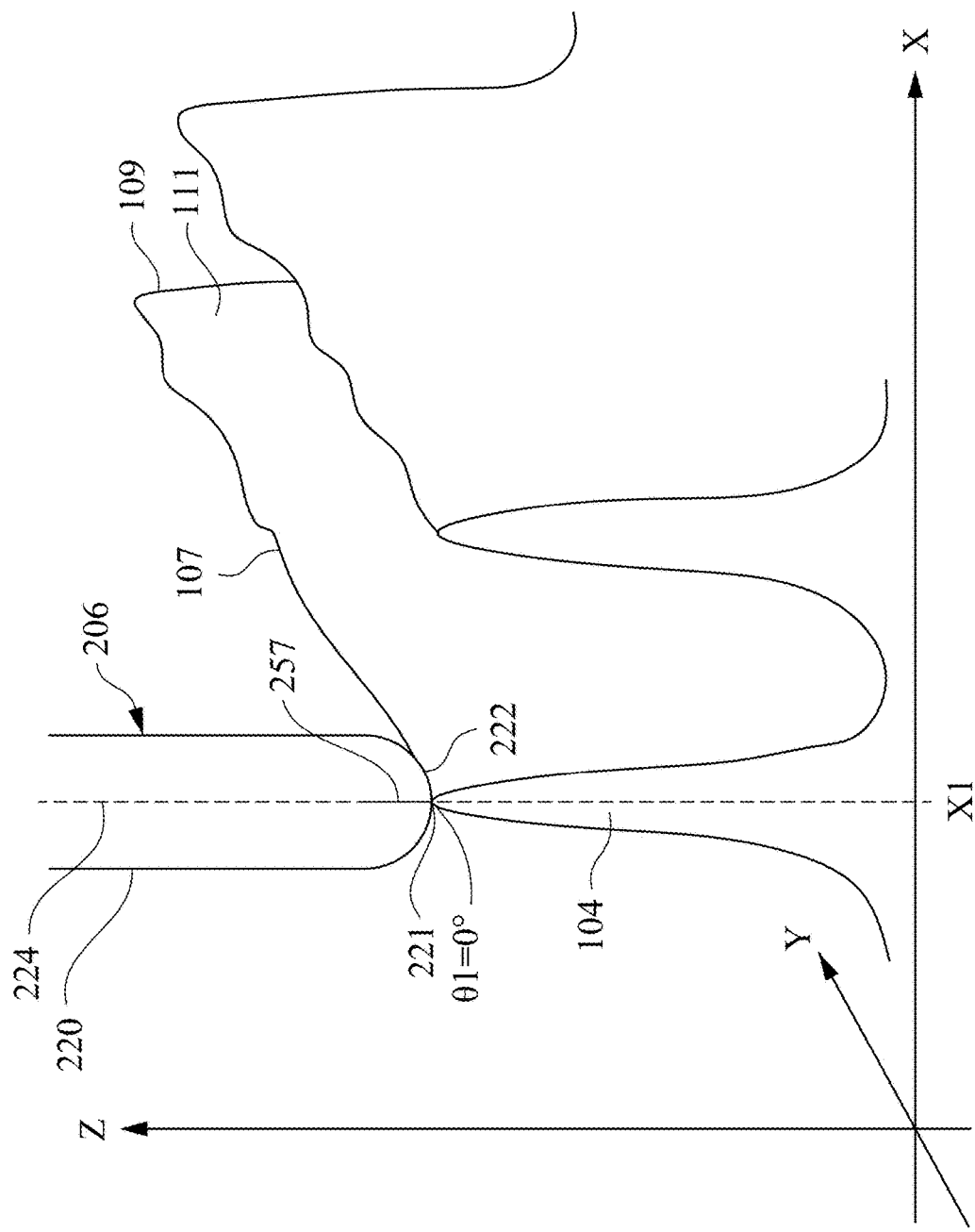
FIGS. 3A to 3D illustrate example scanning movement between a cylindrical scanning probe of FIG. 2C and the fins during a series of interaction periods in accordance with some embodiments of the present disclosure.
Figure 3B:
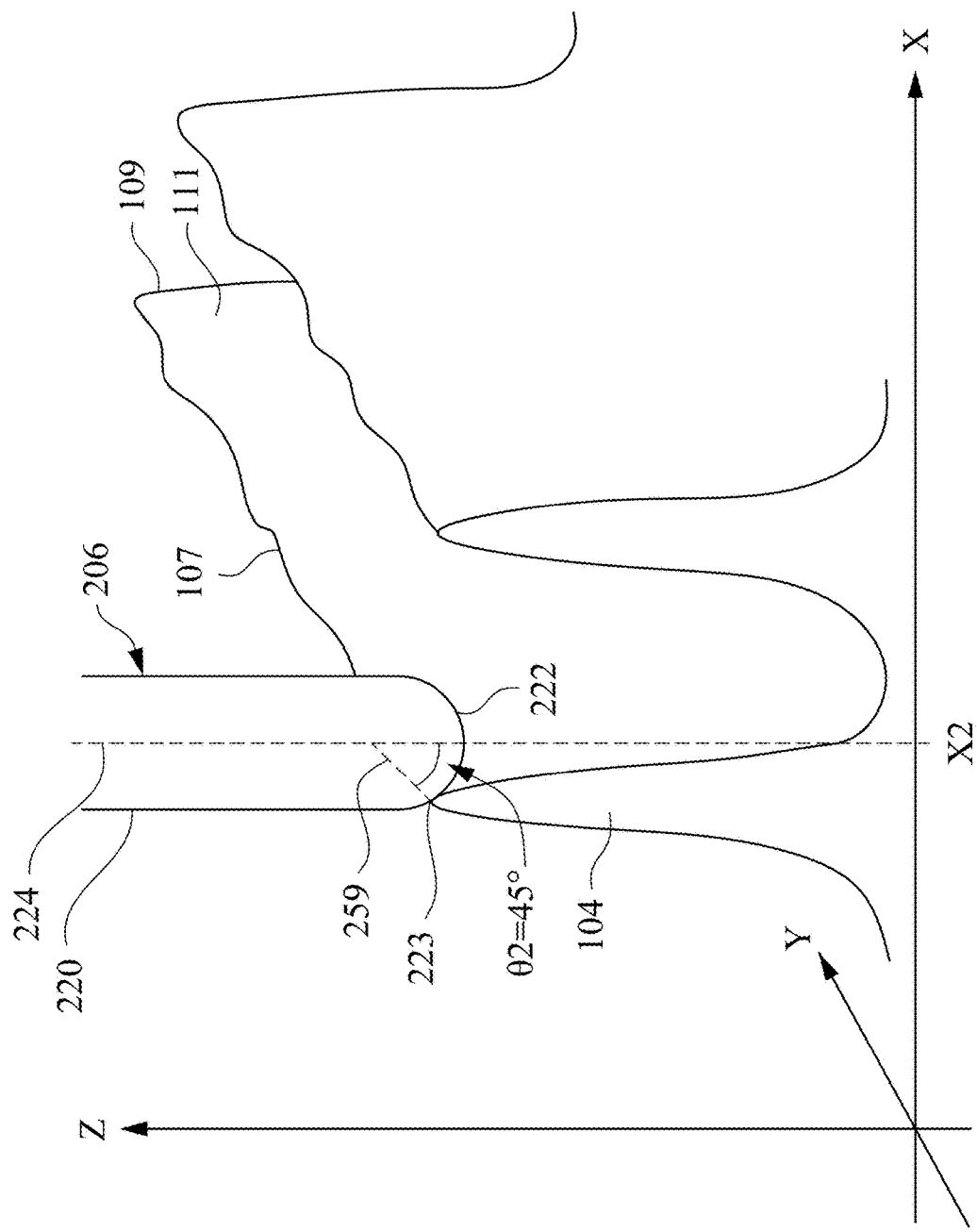
Figure 3C:
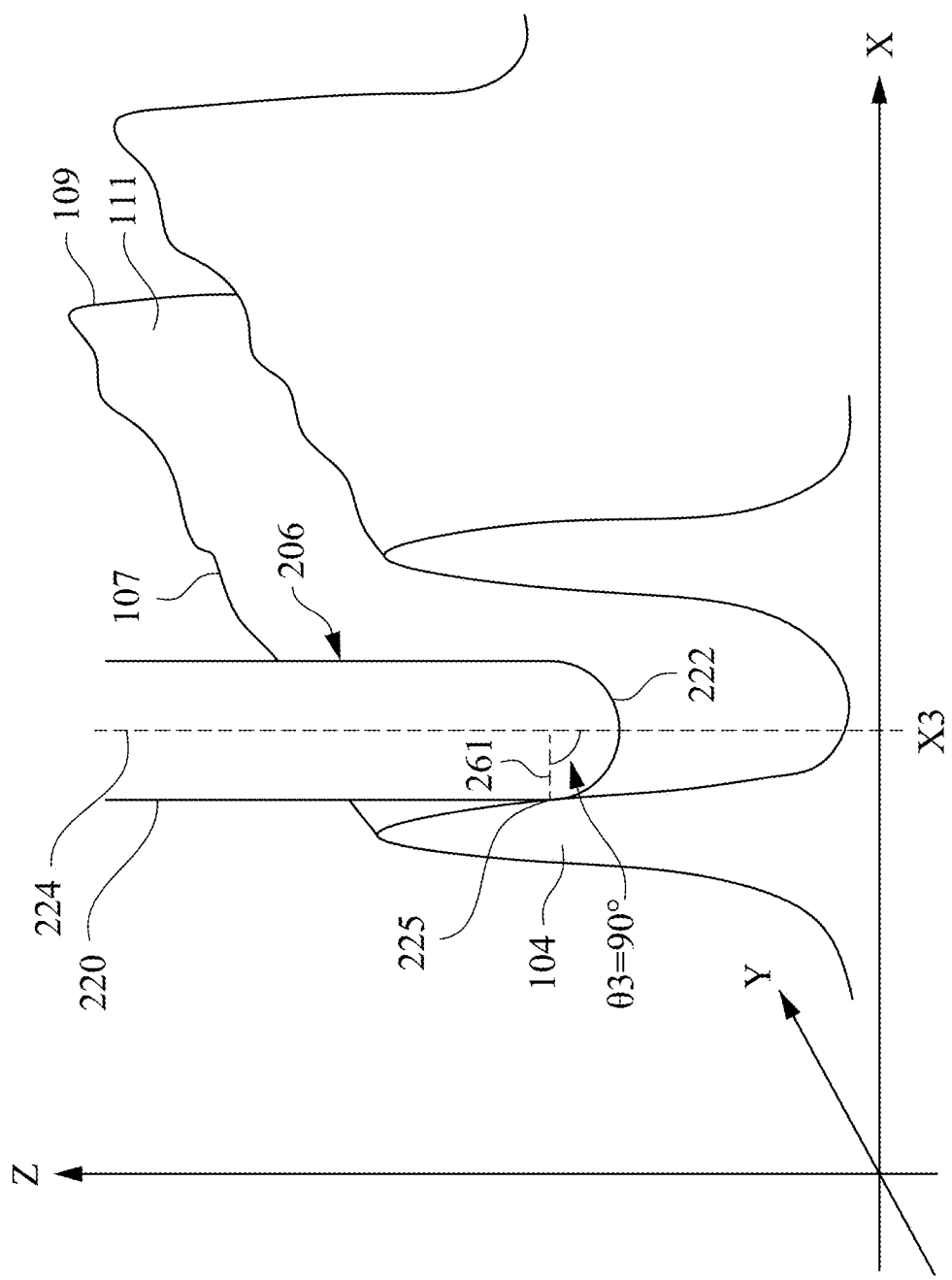
Figure 3D:
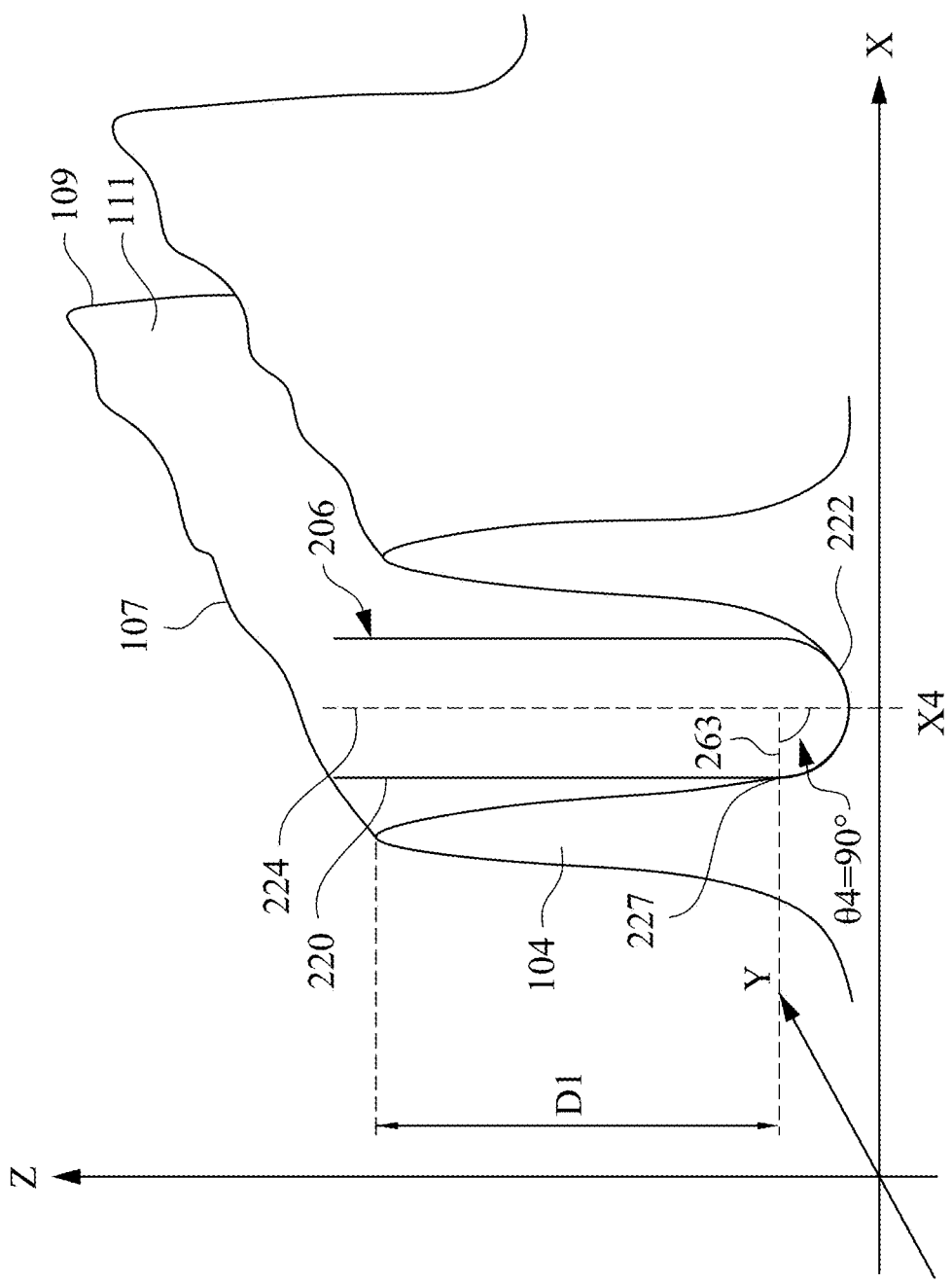

FIG. 3A shows that the scanning probe 206 is driven into vertical oscillation in a tapping-mode and engaged with a top surface 107 of the fin 104. The scanning probe 206 is oscillated at a frequency of about 45 kHz to about 620 kHz, for example about 400 kHz. The probe tip 222 contacts the top surface 107 of the fin 104 at a first scanning location X1. The probe tip 222 contacts the top surface 107 at the contact point 221. The longitudinal axis 224 of the scanning probe 206 forms an angle "θ1" with respect to a line 257 normal to the tangential plane of the probe 206 at the contact point 221. In this example, the angle "θ1" is about 0° since the scanning probe 206 contacts the top surface 107 of the fin 104 through the bottom of the probe tip 222. FIG. 3B shows that the scanning probe 206 moves to a second scanning location X2 and engages with an edge 109 of the fin 104. The probe tip 222 contacts the edge 109 of the fin 104 at the contact point 223. The longitudinal axis 224 of the scanning probe 206 forms an angle "θ2" of about 45° with respect to a line 259 normal to the tangential plane of the probe 206 at the contact point 223. FIG. 3C shows that the scanning probe 206 moves to a third scanning location X3 and engages with an upper portion of the sidewall 111 of the fin 104. The probe tip 222 contacts the upper portion of the sidewall 111 at the contact point 225. The longitudinal axis 224 of the scanning probe 206 forms an angle "θ3" of about 90° with respect to a line 261 normal to the tangential plane of the probe 206 at the contact point 225. FIG. 3D shows that the scanning probe 206 moves to a fourth scanning location X4 and engages with a lower portion of the sidewall 111 of the fin 104. The probe tip 222 contacts the lower portion of the sidewall 111 at the contact point 227. The longitudinal axis 224 of the scanning probe 206 forms an angle "θ4" of about 90° with respect to a line 263 normal to the tangential plane of the probe 206 at the contact point 227.

As can be seen in FIG. 3D, the cylindrical scanning probe 206 allows the probe tip 222 to penetrate the narrow space between dense fins 104 and reach the bottom. Therefore, the scanning probe 206 can fully access (and obtain images of) the sidewalls 111 of the fins 104 at different depths. Particularly, the resolution of the images obtained by the scanning probe 206 can be consistent from fin top to bottom regardless of which point of the probe tip 222 contacts the fin 104 because the spherical-shaped probe tip 222 has a consistent tip radius. The cylindrical scanning probe 206 and the spherical-shaped probe tip 222 thus can provide an effective measurement depth "D1" substantially corresponding to the height of the fins 104. Therefore, the surface characteristics at any depth of the fins 104 can be acquired to provide good line edge roughness (LER) analysis.

In some embodiments, the effective measurement depth "D1" is in a range from greater than about 0 nm to about 80 nm, such as about 5 nm to about 50 nm, for example about 10 nm. The term "effective measurement depth" refers to a distance from a fin top to a depth of the sidewall where the probe tip makes physical contact during the scanning. Therefore, the effective measurement depth can be decreased or increased depending on what type of probe is used. A sharp probe can result in an increased effective measurement depth.

Figure 4A:
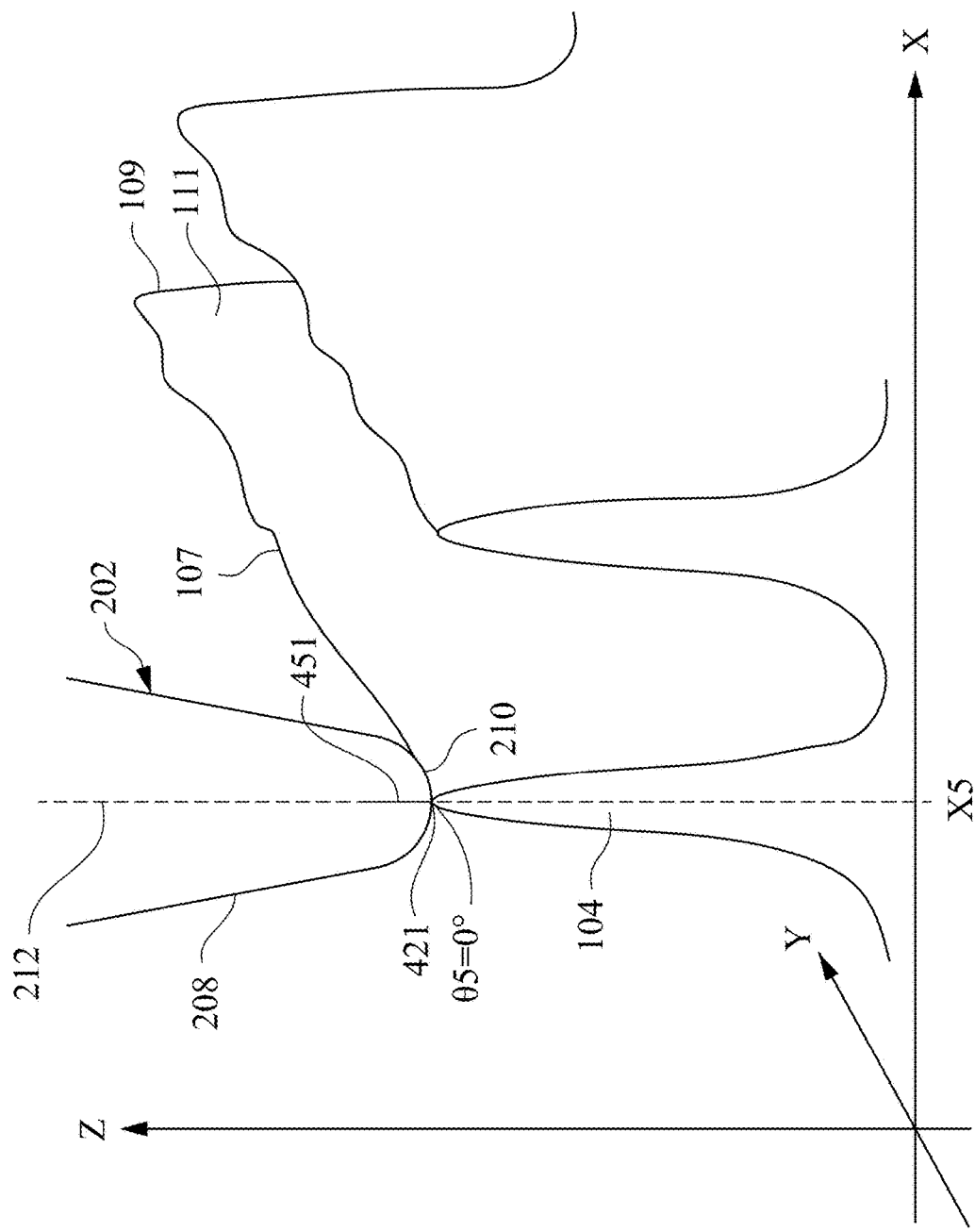
FIGS. 4A to 4C illustrate example scanning movement between a conical scanning probe of FIG. 2A and the fins during a series of interaction periods in accordance with some embodiments of the present disclosure.
Figure 4B:
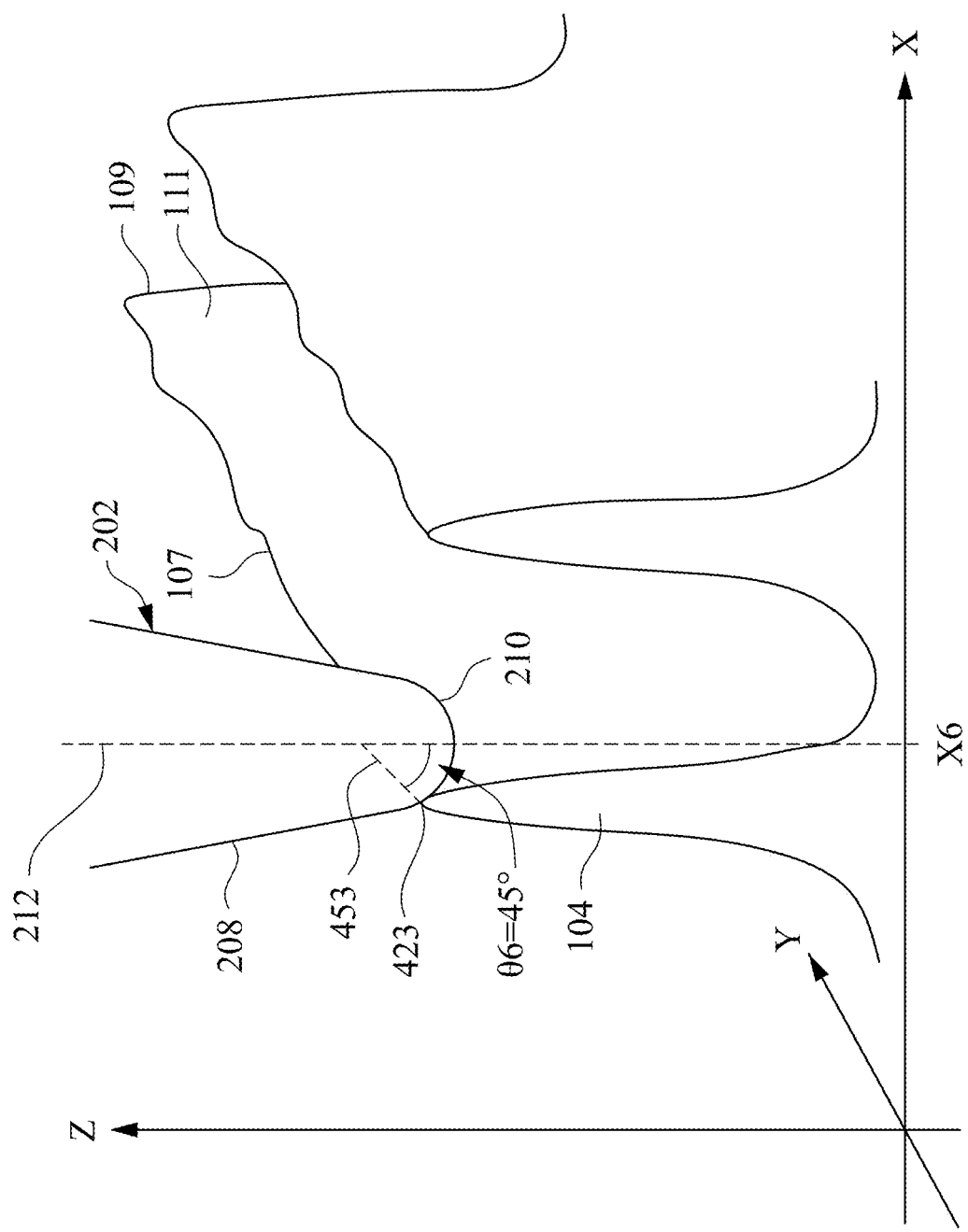
Figure 4C:
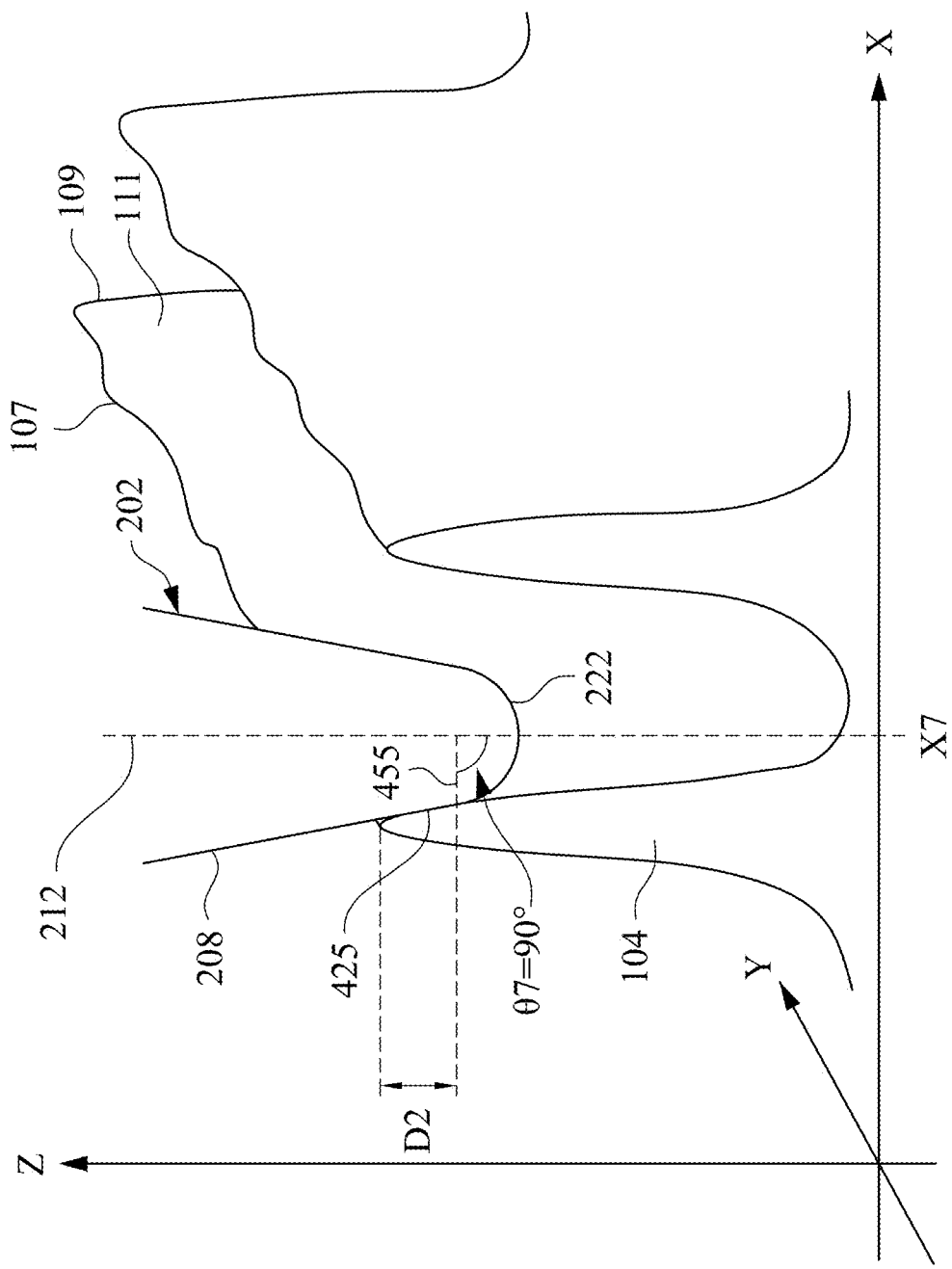

FIGS. 4A to 4C illustrate example scanning movement between the scanning probe 202 of FIG. 2 and the fins 104 during a series of interaction periods in accordance with some embodiments of the present disclosure. The scanning probe 202 is shown to move incrementally along the X-axis at a predetermined distance of about 0.05 nm to about 5 nm, for example about 0.5 nm to about 1 nm. Likewise, the scanning probe 202 is driven into vertical oscillation in a tapping-mode and engages with the top surface 107 of the fin 104, which then scans the surface at a scanning speed about 2 Hz to about 20 Hz. Likewise, the scanning probe 202 is oscillated at a frequency of about 45 kHz to about 620 kHz, for example about 400 kHz.

FIG. 4A shows that the probe tip 210 contacts the top surface 107 of the fin 104 at a fifth scanning location X5. The probe tip 210 contacts the fin 104 at the contact point 421. The longitudinal axis 212 of the scanning probe 202 forms an angle "θ5" with respect to a line 451 normal to the tangential plane of the probe 202 at the contact point 421. In this example, the angle "θ5" is about 0° since the scanning probe 202 contacts the top surface 107 of the fin 104 through the bottom of the probe tip 210. FIG. 4B shows that the scanning probe 202 moves to a sixth scanning location X6 and engages with an edge 109 of the fin 104. The probe tip 210 contacts the edge 109 of the fin 104 at the contact point 423. The longitudinal axis 212 of the scanning probe 202 forms an angle "θ6" of about 45° with respect to a line 453 normal to the tangential plane of the probe 202 at the contact point 423. FIG. 4C shows that the scanning probe 202 moves to a seventh scanning location X7 and engages with an upper portion of the sidewall 111 of the fin 104. The probe tip 210 contacts the upper portion of the sidewall 111 at the contact point 425. The longitudinal axis 212 of the scanning probe 202 forms an angle "θ7" of about 90° with respect to a line 455 normal to the tangential plane of the probe 202 at the contact point 425.

The use of the spherical-shaped probe tip 210 also allows the scanning probe 202 to provide images of the sidewalls 111 at different depths below the fin top with high resolution. However, due to the conical profile of the scanning probe 202, the scanning probe 202 may have an effective measurement depth "D2" shorter than the measurement depth "D1" provided by the cylindrical scanning probe 206. In some embodiments, the effective measurement depth "D2" is in a range from greater than about 0 nm to about 80 nm, such as from about 5 nm to 50 nm, for example about 10 nm. Therefore, the effective measurement depth can be increased if a sharp probe is used. While not discussed herein, it is contemplated that scanning probes with a less-inclined sidewall, such as the scanning probe 204 shown in FIG. 2B, may be used to provide a greater measurement depth in a range from about 35 nm to about 100 nm.

The scanning probes 202, 204, 206 are sized to penetrate into the narrow space between the fins and obtain sub-nanometer resolution AFM images by oscillating the probe tips in vertical movement. The vertical oscillation allows the probe tip to reach different depths from the fin top and be in close proximity to the bottom. Therefore, sub-nanometer resolution images of the fin top and region near the fin top (such as the region within the effective measurement depth of the scanning probes used for obtaining AFM images) can be obtained.

Embodiments of the present disclosure can provide high resolution AFM images of the fin top and/or region near the fin top, such as the region within the effective measurement depth of the scanning probes used for obtaining AFM images. High resolution AFM images obtained by the scanning probes 202, 204, 206 can be selected and processed to provide line edge profile of the fins at a predetermined depth below the fin top for precise LER analysis. FIG. 5 is a flowchart 500 illustrating a method of LER analysis for a semiconductor substrate according to some embodiments of the present disclosure. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially, if not entirely.

The flowchart 500 begins at operation 502 by using an atomic force microscope (AFM) to scan across a substrate at regions of interest. The AFM can be the SPM 112 as discussed above in FIG. 1. The SPM 112 may use the scanning probe 120, or the scanning probes 202, 204, 206 as discussed above with respect to FIGS. 1 and 2, for performing the scanning. The regions of interest may include, for example, center, edge, any location between the center and edge of the substrate, or any combination thereof. In an embodiment, the region scanned is the substrate 102 having fins 104, as shown in FIG. 1. In some examples, the region scanned is the substrate 102 having fins 104 where a metal gate is to be formed. It is contemplated that the region of interest can be any arbitrary location on a substrate, depending upon the application and/or process requirement. In addition, the substrate may be any suitable substrate having fins or trenches with an aspect ratio of about 3:1 or above. The scanning may be conducted by measuring a surface area of 500 nm×500 nm, or a different size of surface area of the substrate 102 with the scanning probes 120, 202, 204, or 206. The measured region may be any pixel resolution, for example 1024×1024, or 2048×2048, etc., depending upon the resolution needed for AFM images. A processor, such as the processor 134 of the control system 132 of FIG. 1, may be used to control the AFM. The scanning may be performed in a manner as discussed in FIG. 3A-3D or 4A-4C to obtain AFM images of the fin in sub-nanometer resolution. The AFM images may include images of the fin 104 at different depths from fin top to bottom, depending on the scanning probes used for the scanning and the effective measurement depth thereof.

Figures 6A, 6B:
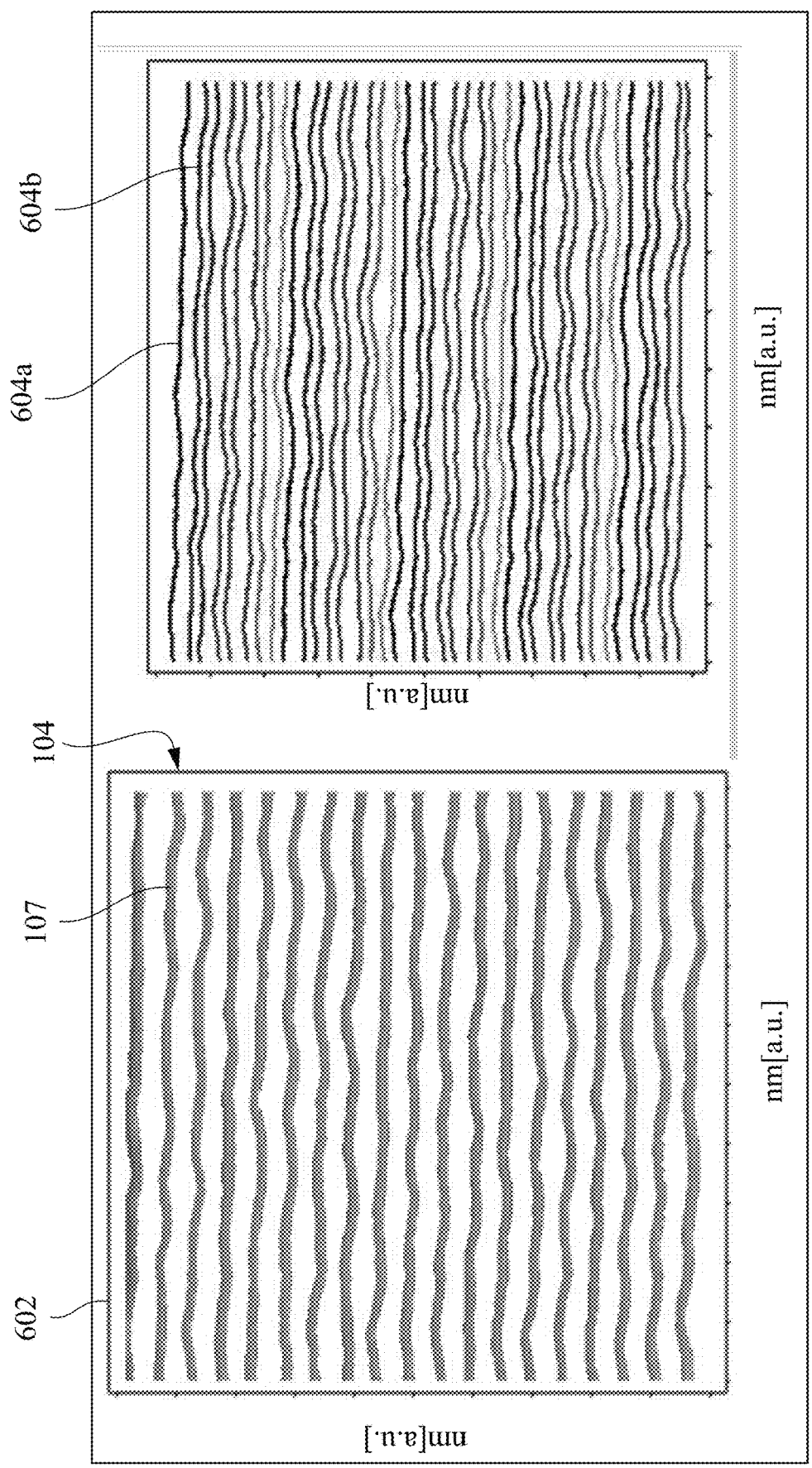
FIG. 6A illustrates an example of a top view of line edge profile of the fins at a predetermined depth according to some embodiments of the present disclosure.
FIG. 6B illustrates edge lines of FIG. 6A according to some embodiments of the present disclosure.

At operation 504, the AFM images of the fins 104 at a predetermined depth are selected to plot line edge profile of the fins. The predetermined depth may be in a range from about 1 nm to about 100 nm, which may vary depending upon the scanning probe used and the effective measurement depth thereof. In an embodiment where a conical scanning probe 202 is used to obtain AFM images, the predetermined depth can be in a range from about 5 nm to 30 nm, measuring from the top surface 107 of the fins 104. The AFM images obtained within this range can have higher resolution since such range falls within the effective measurement depth D2 offered by the conical scanning probe 202. FIG. 6A illustrates an example of a top view of line edge profile 602 of the fins 104 at a predetermined depth of about 10 nm. In this example, a total of 19 fins 104 were captured by measuring a region measuring 500 nm×500 nm with a conical scanning probe, such as the scanning probe 202 of FIG. 2, operating in a tapping mode along a longitudinal direction of the fins 104 at a travel distance of 0.5 nm. The line edge profile is then processed using any suitable software and processor-based system to show only the edge lines of the fins 104, as shown in FIG. 6B. In some embodiments, the edge lines may be leveled using a simple linear regression approach for ease of subsequent analysis. Since there were 19 fins (and each fin has two edge lines when viewing from top) plotted in FIG. 6A, a total of 38 wiggling edge lines are shown in FIG. 6B. For the sake of clarity, only the first two edge lines 604a, 604b representing one of the fins 104 are labeled.

At operation 506, the edge lines of the fins at the predetermined depth are analyzed using a power spectral density (PSD) method to obtain spatial frequency data associated with the edge lines. The PSD method can decompose a waveform of each edge line (e.g., edge lines 604a, 604b) into long-period oscillations and short-period oscillations and plot the amplitude intensity (e.g., power strength) of these oscillation periods as a function of the spatial frequency through Fourier transformation. With PSD, the spatial frequency data associated with the edge lines can be obtained based on the amplitude intensity within spatial frequency ranges selected by the operator. The spatial frequency data can be used to obtain value corresponding to the LER of the fins. Knowing LER of the fins may be important to the process because effects of LER on FinFET performance have become more relevant in sub-45 nm technology nodes or below. It has been observed that the standard deviation of LER of the fins exceeding certain percentage (e.g., 5% or above) may negatively affect critical dimension of the subsequently formed metal gates, causing the gap-filling of the subsequent work-function metal layers to become non-uniform in thickness. As a result, the threshold voltage ($V_{th}$) of the metal gates can be compromised. The LER-induced variation is also found to be correlated with the short channel effect, which may reduce the surface mobility of the carriers. Analyzing the edge lines of the fins using PSD method allows the operator to obtain spatial frequency data of interest and determine LER profile of the fins.

Figure 7:
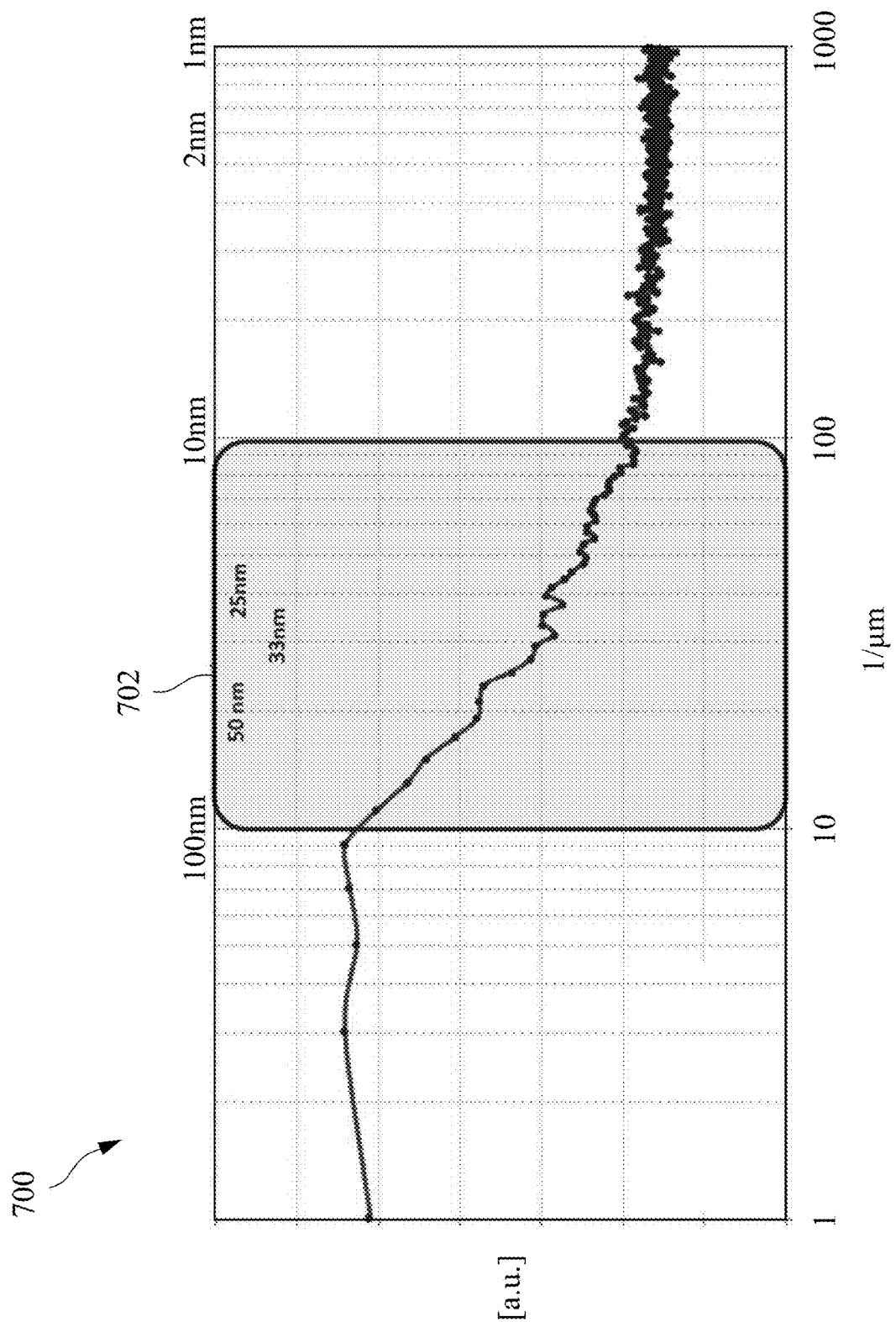
FIG. 7 is an example power spectral density (PSD) plot for edge lines of FIG. 6B according to some embodiments of the present disclosure.

At operation 508, the spatial frequency data of the PSD is selected at interest of the operator to calculate LER profile of the fins. FIG. 7 is an example PSD plot 700 for the edge lines of FIG. 6B according to some embodiments of the present disclosure. As indicated above, the PSD plot provides the amplitude of the oscillation periods (expressed in arbitrary unit) as a function of the spatial frequency. In the embodiment shown in FIG. 7, the spatial frequency is associated with a predetermined wavelength of oscillations periods of the line edge profile, and the predetermined wavelength is in a range from about 1 nm to about 1000 nm. Spatial frequency is the inverse of the wavelength of the oscillation periods. For example, the PSD at the spatial frequency of 10 $\mu m^{-1}$ or less in FIG. 7 will include all amplitude of the oscillation periods greater than 100 nm in wavelength, while the PSD at the spatial frequency of 100 $\mu m^{-1}$ or greater will include all amplitude of the oscillation periods less than 10 nm in wavelength. Since the PSD represents the amplitude of the oscillation periods at a particular spatial frequency, an operator can use PSD plot to calculate the total amplitude of oscillation periods over a given range of wavelength by integrating total PSD within that spatial frequency range. The square root of the integrated value will yield RMS (root mean square), which is an indicator of roughness. With this approach, the operator may select the spatial frequency range of interest to calculate the line edge roughness (LER) of the fins, for example the LER of the fin top and/or region near the fin top, such as the region within the effective measurement depth of the scanning probes used for obtaining AFM images. As the device mobility can be affected by the line edge roughness of the fins, the spatial frequency range may be selected based on its correlation to the device mobility and in a range between about 1 $\mu m^{-1}$ and about 1000 $\mu m^{-1}$, for example 10 $\mu m^{-1}$ and 100 $\mu m^{-1}$. It is contemplated that this spatial frequency range is mere an example and may vary depending upon the application, or the requirement predetermined during the research and development stage.

The wavelength of the oscillation periods may be arbitrarily set based on the process, inspection and/or device requirements to extract spatial frequency data at interest of an operator. For example, the integrated value of PSD at the spatial frequency of, for example, 10 $\mu m^{-1}$ or less (e.g., oscillation periods having a wavelength of 100 nm or above) may be referred to as low spatial frequency data, while the integrated value of PSD at the spatial frequency of, for example, 30 $\mu m^{-1}$ or greater (e.g., oscillation periods having a wavelength of 33 nm or below) may be referred to as high spatial frequency data. The operator may purposely filter out or disregard high spatial frequency data due to the data being associated with excess noise from damping of the scanning probe or cantilever oscillation, or due to the data being identified as from the measurement region other than fin top or regions near the fin top (e.g., bottom region between the fins). In an embodiment shown in FIG. 7, the PSD at a spatial frequency range of 10 $\mu m^{-1}$ to 100 $\mu m^{-1}$ is selected to calculate RMS for all oscillation periods having a wavelength in a range from about 100 nm to about 10 nm, which is highlighted by region 702. This range of the oscillation period is selected because the edge lines of FIG. 6B are found to have a prominent oscillation period in a range from about 25 nm to about 50 nm in wavelength. In most cases, the oscillation period may be considered prominent when the intensity of a particular oscillation period is greater than other oscillation periods by 2 times or above, for example 5 times to 10 times. The prominent oscillation period can be identified/calculated by a processor or a software using the Fourier transform or any suitable mathematical technique. It is contemplated that the operator may select other wavelength range of the oscillation periods to obtain LER at different regions along the longitudinal direction of the fins that may become an issue at a later stage. An example region that may become an issue to the process is the region(s)

where a distance between two adjacent edge lines (e.g., 604a, 604b) is less than a predetermined value (e.g., about 25 nm or below, for example in a range from about 10 to about 20 nm) which may negatively affect critical dimension of the subsequently formed metal gates, and thus, cause the device performance to suffer.

At operation 510, the calculated LER (e.g., RMS for the spatial frequency data of interest) of the fins is compared to a reference LER (of the fins) to determine whether optimization or modification of the fin fabrication process is proceeded. The reference LER may be in a range from about 1 nm to about 10 nm, for example about 2 nm to about 5 nm, which may vary depending upon the application or device requirement. If the calculated LER is outside the range of the reference LER, or if standard deviation of the calculated LER exceeds certain percentage (e.g., 5% or above, for example about 10% or above) of the reference LER, the fin fabrication process may be modified, corrected, or optimized to produce fins with reduced LER. For example, the material properties of the photoresist, the mask roughness, and/or the process parameters of the patterning and/or etching processes used during the lithography for transferring features into the substrate for fabrication of fins may be modified or refined to adjust the LER profile of the fins. Alternatively or additionally, the linewidth of the fins may be adjusted to increase the mechanical strength of the fins, thereby reducing the LER of the fins. In any case, the LER measurement of the fins with an atomic force microscope of the present disclosure using the aforementioned surface roughness (RMS) and power spectral density (PSD) techniques can allow the manufacturer to help fabricate fins with reduced LER or less linewidth variations.

Various embodiments of this disclosure relate generally to a system and methods to determine line edge roughness of a substrate, such as fins of a FinFET device. A probe tip is employed to scan across the fins at target regions of the FinFET device to obtain line edge profile of the fins at the target regions. The line edge profile is then analyzed using a power spectral density (PSD) method to extract line edge roughness of the fins at desired spatial frequency domain. The line edge roughness of the fins can be used to refine or correct process so as to mitigate undesirable line edge roughness and/or linewidth variations. In some cases, the use of a cylinder-shaped AFM probe oscillating in vertical movement allows the probe to reach different depths below the fin top and be in close proximity to the bottom between the adjacent fins. Therefore, sub-nanometer resolution images of the fin top and regions near the fin top can be obtained. In addition, scanning the AFM probe tip in tapping mode can increase the imaging speed since it reduces the lateral forces exerted by the tip on the fin top, thereby reducing tip-fin top wear while providing prolonged tip lifetime.

In an embodiment, a method for measuring a characteristic of a substrate is provided. The method includes scanning over the substrate with a scanning probe microscope, the substrate having fins thereon, the scanning obtaining images showing respective fin top regions of the fins, the scanning probe microscope interacting with respective portions of sidewalls of the fins by a scanning probe oscillated during the scanning, selecting images obtained at a predetermined depth below the fin top regions to obtain a line edge profile of the fins, by a processor-based system, analyzing the line edge profile of the fins using power spectral density (PSD) method to obtain spatial frequency data of the line edge profile of the fins, and by the processor-based system, calculating line edge roughness of the fins based on the spatial frequency data.

In another embodiment, a method includes scanning a surface of the substrate with a scanning probe, the substrate having fins extended upwardly, the scanning obtaining images showing a line edge profile of the fins, the scanning probe using a spherical-shaped probe tip driven into vertical oscillation to engage with at least a portion of a sidewall of the fins during a series of interaction periods, by a processor-based system, analyzing the line edge profile of the fins using power spectral density (PSD) method to obtain spatial frequency data of the line edge profile of the fins, and by the processor-based system, calculating line edge roughness of the fins based on the spatial frequency data.

In yet another embodiment, a system is provided. The system includes a processor and a non-transitory computer readable medium connected to the processor. The non-transitory computer readable medium containing computer-executable instructions, which when executed by the processor, are operable to cause a scanning probe microscope to scan a surface of a substrate with a scanning probe, the substrate having fins extended upwardly, the scanning obtaining images showing respective fin top regions of the fins, the scanning probe interacting with respective portions of sidewalls of the fins by a spherical-shaped probe tip oscillated during a series of interaction periods, select images obtained at a predetermined depth below the fin top regions to plot a line edge profile of the fins, analyze the line edge profile of the fins using power spectral density (PSD) method to obtain spatial frequency data of the line edge profile of the fins, and calculate line edge roughness of the fins based on the spatial frequency data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for measuring a characteristic of a substrate, the method comprising:
scanning over the substrate with a scanning probe microscope, the substrate having three-dimensional structures thereon, the scanning obtaining images showing respective regions of the three-dimensional structures;
selecting images obtained at a predetermined depth below the regions to obtain a topographical feature profile of the three-dimensional structures;
by a processor-based system, analyzing the topographical feature profile of the three-dimensional structures using a power spectral density (PSD) method to obtain spatial frequency data of the topographical feature profile of the three-dimensional structures; and
by the processor-based system, calculating a topographical feature characteristic of the three-dimensional structures based on the spatial frequency data.

2. The method of claim 1, further comprising:
modifying a three dimensional structure fabrication process based on the calculated topographical feature characteristic.

3. The method of claim 1, wherein the scanning probe microscope is an atomic force microscope (AFM).

4. The method of claim 1, wherein the scanning is performed at one or more target regions where a metal gate is to be formed over the three dimensional structures.

5. The method of claim 1, wherein the scanning is performed by measuring a 500 nm×500 nm or larger region of the substrate with the scanning probe.

6. The method of claim 1, wherein the predetermined depth is in a range from greater than about 0 nm to about 80 nm.

7. The method of claim 1, wherein the scanning is operated in a tapping mode along a longitudinal direction of the three-dimensional structures.

8. The method of claim 1, further comprising the scanning probe microscope interacting with respective portions of sidewalls of the three-dimensional structures by a scanning probe oscillated during the scanning, wherein the spatial frequency data is associated with a predetermined wavelength of oscillations periods of the line edge profile, and the predetermined wavelength is in a range from about 1 nm to about 1000 nm.

9. A method for measuring a surface of a substrate, the method comprising:
scanning a surface of the substrate with a scanning probe, the substrate having three-dimensional structures extended upwardly, the scanning obtaining images showing a topographical feature profile of the three-dimensional structures, the scanning probe using a probe tip driven into oscillation to engage with at least a portion of a sidewall of the three-dimensional structures during a series of interaction periods;
by a processor-based system, analyzing the topographical feature profile of the three-dimensional structures using a power spectral density (PSD) method to obtain spatial frequency data of the topographical feature profile of the three-dimensional structures; and
by the processor-based system, calculating a topographical feature characteristic of the three-dimensional structures based on the spatial frequency data.

10. The method of claim 9, wherein the scanning probe has a spherical shaped probe tip and a conical sidewall extending in a direction at a first angle with respect to a longitudinal axis of the scanning probe, wherein the first angle is in a range of about 1° to about 20°.

11. The method of claim 9, wherein the scanning probe has a spherical shaped probe tip and a straight sidewall parallel to a longitudinal axis of the scanning probe.

12. The method of claim 9, wherein the scanning probe has a diameter less than a three-dimensional structure to the three-dimensional structure spacing between neighboring pairs of the three-dimensional structures.

13. The method of claim 9, wherein the scanning is operated in a tapping mode along a longitudinal direction of the three-dimensional structures.

14. The method of claim 9, wherein scanning a surface of the substrate with a scanning probe is performed in an environmentally controlled chamber in which the moisture is under 0.5 ppm and oxygen is under 1 ppm.

15. The method of claim 9, further comprising:
by the processor-based system, determining a spatial frequency range based on an oscillation period of the topographical feature profile, and the topographical feature characteristic of the three-dimensional structures is calculated based on the spatial frequency data in the spatial frequency range.

16. A system, comprising:
a processor; and
a non-transitory computer readable medium connected to the processor, the non-transitory computer readable medium containing computer-executable instructions, which when executed by the processor, are operable to:
cause a scanning probe microscope to scan a surface of a substrate with a scanning probe, the substrate having three-dimensional structures extended upwardly, the scanning obtaining images showing respective regions of the three-dimensional structures, the scanning probe interacting with respective portions of sidewalls of the three-dimensional structures by a probe tip oscillated during a series of interaction periods;
select images obtained at a predetermined depth below the regions to plot a topographical feature profile of the three-dimensional structures;
analyze the topographical feature profile of the three-dimensional structures using power spectral density (PSD) method to obtain spatial frequency data of the topographical feature profile of the three-dimensional structures; and
calculate a topographical feature characteristic roughness of the three-dimensional structures based on the spatial frequency data.

17. The system of claim 16, wherein the computer-executable instructions, when executed by the processor, cause the processor to compare the calculated topographical feature characteristic of the three-dimensional structures with a reference topographical feature characteristic to determine if a modification to a three-dimensional structure fabrication process is to be proceeded.

18. The system of claim 16, wherein the computer-executable instructions, when executed by the processor, cause the scanning probe microscope to operate in a tapping mode along a longitudinal direction of the three-dimensional structures.

19. The system of claim 16, wherein the predetermined depth is in a range between about 0 nm and about 80 nm.

20. The system of claim 16, wherein the spatial frequency data is associated with a predetermined wavelength of oscillations periods of the line edge profile, and the predetermined wavelength is in a range between 1 nm and 1000 nm.

* * * * *